United States Patent [19]

Heimbigner et al.

[11] 4,112,296
[45] Sep. 5, 1978

[54] DATA LATCH

[75] Inventors: Gary L. Heimbigner, Anaheim; Robert K. Booher, El Toro, both of Calif.

[73] Assignee: Rockwell International Corporation, El Segundo, Calif.

[21] Appl. No.: 804,220

[22] Filed: Jun. 7, 1977

[51] Int. Cl.² .................. H03K 3/286; H03K 3/353; H03K 5/18; H03K 17/28
[52] U.S. Cl. .................. 307/279; 307/247 R; 307/291; 307/353; 307/200 B
[58] Field of Search .......... 307/220 R, 220 C, 221 R, 307/221 C, 205, 215, 247 R, 279, 289, 291, 208, 352, 353, 200 B; 328/92, 195, 200, 206

[56] References Cited

U.S. PATENT DOCUMENTS

| | | | |
|---|---|---|---|
| 3,292,008 | 12/1966 | Rapp | 307/247 R |
| 3,624,423 | 11/1971 | Borgini | 307/279 |
| 3,668,438 | 6/1972 | Cheney et al. | 307/221 C X |
| 3,840,757 | 10/1974 | Nomiya et al. | 307/247 R X |
| 3,854,059 | 12/1974 | Nomiya et al. | 307/279 X |
| 3,921,011 | 11/1975 | Orgill | 307/279 X |
| 3,953,744 | 4/1976 | Kawagoe | 307/208 |
| 4,001,611 | 1/1977 | Maruyama et al. | 307/289 X |
| 4,063,113 | 12/1977 | O'Dell | 307/224 C X |
| 4,074,148 | 2/1978 | Sato | 307/279 |

FOREIGN PATENT DOCUMENTS 2,029,729  1/1971  Fed. Rep. of Germany ....... 307/221 C

*Primary Examiner*—Larry N. Anagnos
*Attorney, Agent, or Firm*—H. Fredrick Hamann; G. Donald Weber, Jr.; Morland C. Fischer

[57] ABSTRACT

An improved, compact, power saving data latch having utilization as a synchronizer circuit or as a circuit to sample and store input data for subsequent signal processing. The presently improved data latch is fabricated by means including a static flip-flop cell. A transmission gate is connected between an input terminal of the flip-flop cell and a source of input data. A source of clock signals is connected to another input terminal of the flip-flop cell and to a control electrode of the transmission gate to control the conductivity of the transmission gate and the sampling of input data by the flip-flop cell.

10 Claims, 4 Drawing Figures

DATA LATCH

BACKGROUND OF THE INVENTION

1. Field of the Invention

This invention relates to an improved data latch for sampling and storing an input data signal during a sampling time interval and for providing a corresponding output signal having one of two clearly distinguishable logic levels during a subsequent time interval.

2. Statement of the Prior Art

As known to those skilled in the art, an asynchronous input signal can be sampled and held by conventional data latching circuits. However, if during the sampling time interval, the data latching circuit receives an input signal that is undergoing a transition from, for example, a logical zero level to a logical one level, a corresponding voltage may be stored, which voltage level lies somewhere in the range between a valid logical zero and a valid logical one. As a result, during a subsequent time interval, other compatible circuits cannot distinguish between a logical zero and a logical one when receiving the stored signal from the output of a conventional data latching circuit for further signal processing. As a result, these receiving circuits would incorrectly interpret the logic level of the original sampled input signal.

Moreover, prior art data latching circuits utilize a relatively large number of components. Therefore, the required semiconductor chip area and the corresponding cost of fabrication are undesirably increased. What is more, such conventional data latching circuits consume relatively large amounts of power.

Examples of prior art clock controlled, field effect transistor flip-flop storage circuits are as follows: U.S. Pat. Nos.

| | |
|---|---|
| 3,292,008 | Rapp |
| 3,624,423 | Borgini |
| 3,921,011 | Orgill |
| 3,983,420 | Kikuchi |

SUMMARY OF THE INVENTION

Briefly, and in general terms, an improved data latch is disclosed, which data latch is comprised of a pair of cross-coupled NOR gates. The pair of NOR gates are arranged to form a static flip-flop storage cell. A field effect transistor sampling gate is connected in electrical series between a source of input data, to be sampled during a sampling time interval, and a first input terminal of the flip-flop storage cell. Dynamic storage means, such as, for example, a capacitor, is also connected to the first input terminal of the flip-flop storage cell to receive and temporarily store the sampled input data signal during the sampling time interval. A source of clock enabling signals is connected to a second input terminal of the flip-flop storage cell and to the gate electrode of the field effect transistor sampling gate to control both the conductivity of the sampling gate and the sampling of input signals by the flip-flop. The presently improved data latch has particular utility as a compact and power saving circuit to sample and store input data for subsequent signal processing and as a synchronizer for providing an output signal to a suitable signal processing circuit, which output signal has one of two clearly distinguishable logic levels.

DESCRIPTION OF THE PREFERRED EMBODIMENT

Figure 1:
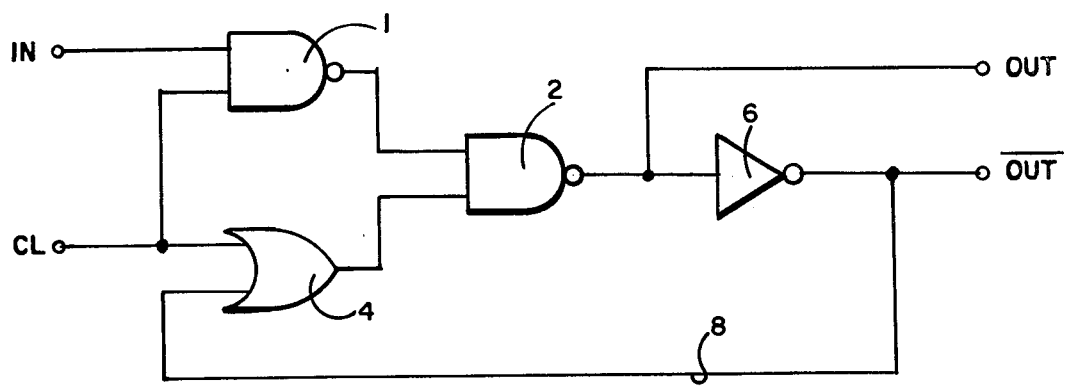
FIG. 1 shows one example of the logic implementation for a prior art input data latch.

FIG. 1 shows one example of the logic implementation for a prior art input data latch. Briefly, the prior art input data latch includes a pair of conventional NAND gates 1 and 2, a conventional OR gate 4 and a conventional inverter-amplifier gate 6. A first input terminal of NAND gate 1 is connected to receive an input data signal IN. A second input terminal of NAND gate 1 and a first input terminal of OR gate 4 are connected together to receive a clock signal CL. The output terminals of both the NAND gate 1 and the OR gate 4 are respectively connected to input terminals of the NAND gate 2. The output terminal of the NAND gate 2 comprises one output terminal of the prior art input data latch for providing an output signal OUT having a reference voltage corresponding to a first logic level. The output terminal of NAND gate 2 is also connected to the input of inverter-amplifier gate 6. The output of the inverter-amplifier gate 6 comprises a second output terminal of the prior art input data latch for providing a complementary output signal $\overline{OUT}$ having a reference voltage corresponding to a second logic level. The output terminal of the inverter-amplifier gate 6 is also connected, via a feedback path 8, to a second input terminal of OR gate 4.

By way of example, the four logic gates (1, 2, 4 and 6) which comprise the prior art input data latch of FIG. 1 may be typically mechanized by a circuit including the interconnection of nine multi-terminal semiconductor devices, such as, for example, field effect transistors (not shown). However, for a more detailed explanation of the mechanization and operation of the prior art input data latch illustrated in FIG. 1, reference can be made to U.S. Pat. No. 3,746,882, issued July 17, 1973.

Figure 2:
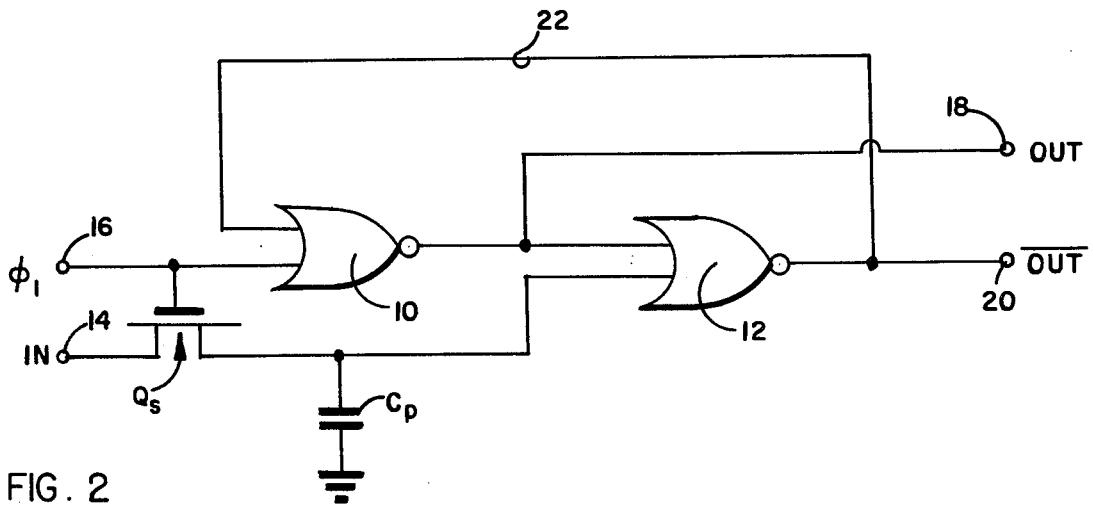
FIG. 2 shows the compact logic implementation of the improved data latch which forms the present invention.

FIG. 2 shows the logic implementation of the compact and economical, power saving input data latch which forms the instant invention. The present data latch is comprised of first and second conventional NOR gates 10 and 12. An input signal IN, to be sampled and stored for subsequent signal processing, is applied to data latch input terminal 14. The conduction path of a multi-terminal, semiconductor sampling gate, such as a field effect transistor $Q_5$, is connected between the data latch input terminal 14 and one input terminal of the NOR gate 12. A clock terminal means 16 is connected to one input terminal of the NOR gate 10. However, the clock terminal means is also connected to the control or gate electrode of the sampling gate, FET $Q_2$, to control the conductivity thereof. The output terminal 18 of the NOR gate 10 forms a first output terminal of the presently improved data latch. Output terminal 18 is adapted to receive a signal having a reference voltage corresponding to a logic level, designated OUT. The output terminal of the NOR gate 10 is also connected to a second input terminal of the NOR gate 12. The output terminal 20 of the NOR gate 12 forms a second output terminal of the present data latch. As will be explained in greater detail hereinafter, the data latch output terminal 20 is adapted to receive a signal having a reference voltage corresponding to a logic level, designated $\overline{\text{OUT}}$. The output terminal 20 of the NOR gate 12 is also connected, via a feedback path 22, to a second input terminal of the NOR gate 10. One parasitic capacitance of the data latch is represented by a capacitor $C_p$. One plate of capacitor $C_p$ is connected to the first input terminal of the NOR gate 12. The second plate of the capacitor $C_p$ is connected to a source of reference potential, such as ground.

Figure 3:
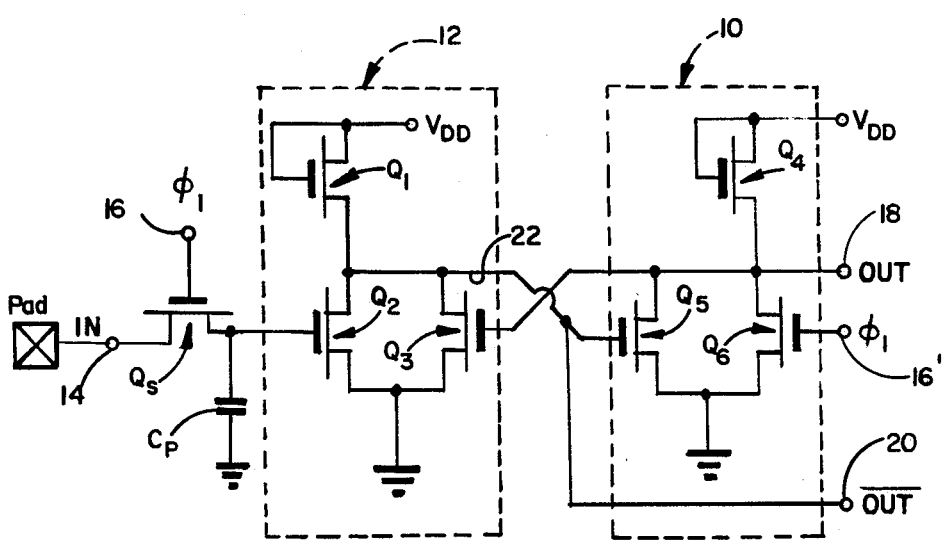
FIG. 3 shows the schematic circuit for mechanizing the improved data latch of FIG. 2.

FIG. 3 shows the schematic circuit for a preferred embodiment of the improved data latch which forms the present invention. The NOR gate 12 is comprised of first and second multi-terminal semiconductor devices, such as FET $Q_2$ and $Q_3$. FETS $Q_2$ and $Q_3$ have respective conduction path electrodes connected between a common electrical junction formed with the data latch output terminal 20 and a source of reference potential, such as ground. NOR gate 12 also includes a voltage pull-up device, such as FET $Q_1$. One conduction path electrode and the control or gate electrode of FET $Q_1$ are connected together and to a source of reference potential, $V_{DD}$. The second conduction path electrode of FET $Q_1$ is connected to the common electrical junction which includes the data latch output terminal 20.

The sampling gate, FET $Q_s$, has conduction path electrodes connected in electrical series between the data latch input terminal 14 and the control or gate electrode of FET $Q_2$. The gate electrode of FET $Q_s$ is connected to the clock terminal 16 to receive a clock signal designated $\phi_1$. Data latch input terminal 14 is connected to a semiconductor chip pad which provides the present data latch with a source of input signals IN. Capacitor $C_p$, which represents (in a preferred embodiment, but is not limited to) a portion of the total circuit parasitic capacitance (including, for example, the gate capacitance of FET $Q_2$), is connected between the gate electrode of FET $Q_2$ and the source of reference potential, such as ground.

The NOR gate 10 is comprised of first and second multi-terminal semiconductor devices, such as FETs $Q_5$ and $Q_6$. FETs $Q_5$ and $Q_6$ have respective conduction path electrodes connected between a common electrical junction formed with the data latch output terminal 18 and a source of reference potential, such as ground. NOR gate 10 also includes a voltage pull-up device, such as a FET $Q_4$. One conduction path electrode and the control or gate electrode of FET $Q_4$ are connected together and to a source of reference potential, $V_{DD}$. The second conduction path electrode of FET $Q_4$ is connected to the common electrical junction which includes the data latch output terminal 18. The gate electrode of FET $Q_6$ is connected to a clock terminal 16' to receive the clock signal $\phi_1$. It is to be understood, however, that clock terminals 16 and 16' may comprise a single clock terminal means.

The common electrical junction, including the output terminal 18 of the NOR gate 10, which terminal forms one output terminal of the present data latch, is connected to the gate electrode of FET $Q_3$. The common electrical junction including the output terminal 20 of NOR gate 12, which terminal forms a second output terminal of the present data latch, is connected, via feedback path 22, to the gate electrode of FET $Q_5$. Hence, FET $Q_3$ and $Q_5$ of NOR gates 10 and 12 comprises a cross-coupled data latch for signals at the respective output terminals 18 and 20. As will be recognized by those skilled in the art, cross-coupled NOR gates 10 and 12 comprise a flip-flop cell.

As utilized in the schematic diagram of FIG. 3 FETs $Q_1$–$Q_6$, which comprise NOR gates 10 and 12, and N channel enhancement mode field effect transistor devices. However, these or any other suitable transistor device (e.g. PMOS) may also be employed. Moreover, voltage pull-up devices FETs $Q_1$ and $Q_4$ may be replaced by suitable resistors. However, the sizes of devices $Q_1$–$Q_6$ are selected so that the corresponding impedances of devices $Q_2$ and $Q_3$ are ratioed with respect to that of device $Q_1$, and the impedances of devices $Q_5$ and $Q_6$ are ratioed with respect to that of device $Q_4$. What is more, device $Q_2$ is selected with a size (i.e. a channel width) which is substantially larger (e.g. by a factor of 2) than that of either of devices $Q_3$–$Q_6$.

Figure 4:
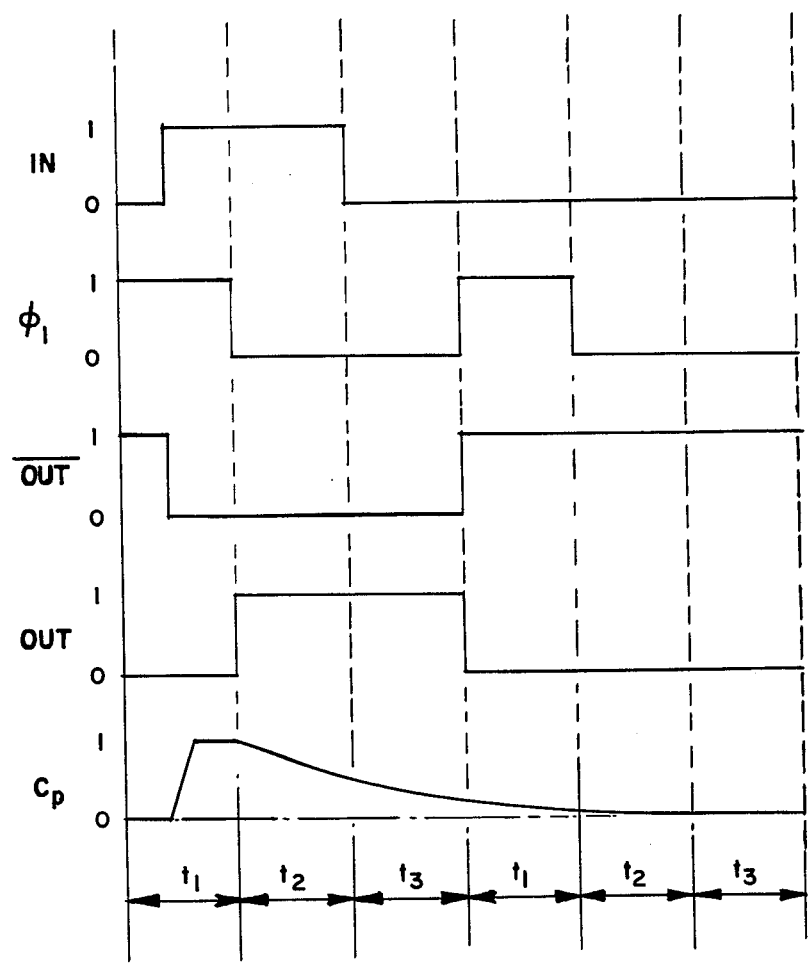
FIG. 4 is a timing diagram showing the relationship of the logic level signals which are supplied to the input and output terminals of the improved data latch of FIGS. 2 and 3.

The operation of the presently improved data latch circuit is explained by concurrently referring to FIGS. 3 and 4. During an interval of time, designated $t_1$ in FIG. 4, the clock terminals 16 and 16' receive a relatively HI (i.e. corresponding to a logical "1") clock signal $\phi_1$. The sampling gates FET $Q_s$ is rendered conductive, inasmuch as the gate electrode thereof is connected to the clock terminal 16. Therefore, a data input signal IN is sampled during the $t_1$ time interval by an input terminal of NOR gate 12 (the gate electrode of FET $Q_2$) via the input terminal 14 of the present data latch circuit and the conduction path of the sampling gate FET $Q_s$. FET $Q_6$ is also rendered conductive, inasmuch as the gate electrode thereof is connected to clock terminal 16'. Thus, during the $t_1$ time interval, when the $\phi_1$ clock signal is relatively HI, output terminal 18 of the present data latch circuit receives a signal OUT having a relatively LOW logic level, inasmuch as output terminal 18 is clamped to ground via the conduction path of FET $Q_6$. Also during the $t_1$ time interval, FET $Q_3$ is rendered non-conductive, inasmuch as the gate electrode thereof is clamped to ground via the conduction path of FET $Q_6$ and the common electrical junction formed with data latch output terminal 18. Therefore, FETs $Q_1$ and $Q_2$, which comprise NOR gate 12, operate as a well known inverter during the $t_1$ time interval. That is, if the logic level of the input signal IN, which is supplied from the semiconductor chip pad to the data latch input terminal 14, is relatively HI, the parasitic capacitance $C_P$ is charged (to a voltage approximately equivalent to the voltage of the HI signal minus a threshold level drop of the sampling gate FET $Q_s$), the FET $Q_2$ is rendered conductive. As will be explained hereinafter, the parasitic capacitance $C_p$ provides dynamic storage of input signals IN that are supplied to the input terminal 14 of the present data latch during the signal time interval $t_1$. The common electrical junction which includes data latch output terminal 20 is clamped to ground via the conduction path FET $Q_2$. Therefore, due to the signal inversion performed by FETs $Q_1$ and $Q_2$, when the logic level of the input signal IN is relatively HI during the $t_1$ time interval, the output terminal 20 of the present data latch circuit receives a signal $\overline{\text{OUT}}$ having a relatively LOW logic level.

However, and by way of further example, if the logic level of the input signal IN to be sampled during the $t_1$ time interval is relatively LOW, FET $Q_2$ is rendered non-conductive. As previously disclosed, the output terminal 18 of the present data latch circuit is clamped to ground during the $t_1$ time interval via the conduction path of FET $Q_6$, so that output terminal 18 receives a signal OUT having a relatively LOW logic level. As also disclosed, FET $Q_3$ is rendered non-conductive, inasmuch as the gate electrode thereof is clamped to ground during the $t_1$ time interval via the conduction path of FET $Q_6$. As a result, when the logic level of the input signal IN is relatively LOW during $t_1$ time interval, the output terminal 20 of the present data latch circuit receives a signal $\overline{OUT}$ having a relatively HI logic level via the conduction path of FET $Q_1$.

During an interval of time, designated $t_2$, the clock terminals 16 and 16' each receive a relatively LOW (i.e. corresponding to a logical "0") clock signal $\phi_1$. The sampling FET $Q_s$ is rendered non-conductive, inasmuch as the gate electrode thereof is connected to the clock terminal 16. Moreover, FET $Q_6$ is also rendered non-conductive, inasmuch as the gate electrode thereof is connected to clock terminal 16'. Therefore, during the $t_2$ time interval, the output terminal 18 of the present data latch circuit is no longer clamped to ground via the conduction path of FET $Q_6$. If the parasitic capacitance $C_p$ were initially charged (inasmuch as a relatively HI input signal IN was sampled by the input terminal 14 of the data latch circuit during the $t_1$ time interval), FET $Q_2$ remains conductive during the $t_2$ time interval, as a result of the driving voltage applied to the gate electrode thereof by capacitor $C_p$. Therefore, the output terminal 20 of the present data latch circuit remains clamped to ground via the conduction path of FET $Q_2$. Hence, output terminal 20 continues to receive a signal $\overline{OUT}$ having a relatively LOW logic level. FET $Q_5$ is rendered non-conductive during the $t_2$ time interval, inasmuch as the gate electrode thereof is also clamped to ground via the conduction path FET $Q_2$ and the common electrical junction formed with output terminal 20. FETs $Q_4$ and $Q_6$, which comprise NOR gate 10, operate as a well known inverter during the $t_2$ time interval. As a result of the signal inversion performed by the FETs $Q_4$ and $Q_6$ (relative to the signal $\phi_1$ applied to clock terminal 16') and since the $\phi_1$ clock signal is relatively LOW during the $t_2$ time interval, the output terminal 18 of the present data latch receives a signal OUT via the conduction path of FET $Q_4$ having a relatively HI logic level.

During a succeeding interval of time, designated $t_3$, the clock terminals 16 and 16' continue to receive a relatively LOW clock signal $\phi_1$, and FETs $Q_s$ and $Q_6$ continue to be rendered non-conductive. The capacitor $C_p$, if initially charged during the previous $t_1$ sampling time interval, will begin to leak the stored charge. As the capacitor $C_p$ discharges (toward a relatively LOW logic level voltage, such as ground), FET $Q_2$ is rendered non-conductive due to the diminished threshold voltage at the gate electrode thereof. As will be understood by those skilled in the art, the capacitor $C_p$ provides dynamic (i.e. temporary) storage of input data signals that are sampled during the $t_1$ time interval, while the flip-flop cell comprised of NOR gates 10 and 12 provides static storage of the data signals, regardless of the passage of time.

Thus, during the $t_3$ time interval, FET $Q_3$ continues to be rendered conductive, inasmuch as the gate electrode thereof receive sufficient threshold voltage via the conduction path of FET $Q_4$ and the common electrical junction formed with the present data latch output terminal 18. Therefore, output terminal 18 continues to receive a signal OUT having a relatively HI logic level. Moreover, FET $Q_5$ continues to be rendered non-conductive, inasmuch as the gate electrode thereof is clamped to ground via the conduction path of FET $Q_3$ and the common electrical junction formed by the present data latch output terminal 20. Because of the nature of cross-coupled latch including FETs $Q_3$ and $Q_5$, FET $Q_3$ is driven harder, while FET $Q_5$ is forced into a more non-conductive condition. Therefore, during the $t_3$ time interval output terminal 20 continues to receive a signal $\overline{OUT}$ having a relatively LOW logic level.

The input data latch circuit herein disclosed uses fewer components (e.g. 7 devices) and consumes less space that prior art latch circuits. Moreover, the present data latch circuit requires a reduced number of voltage pull-up devices (e.g. FETs $Q_1$ and $Q_4$) so as to minimize power consumption. While the present data latch is described as an improved circuit to sample and store input data signals (such as, for example, coded address signals), the present data latch also has utility as a synchronizer circuit. That is, regardless of the voltage level of the input signal IN during the sampling time interval $t_1$, the loop gain of the flip-flop comprised of NOR gates 10 and 12 is greater than 1. The output signals OUT and $\overline{OUT}$ are, therefore, forced to either one of a good logical "0" or "1", which signal levels are clearly distinguishable from one another. Thus, during subsequent time intervals, $t_2$ and $t_3$, the output signals are in a suitable condition to be supplied to and processed by other compatible receiving circuits.

Having thus set forth a preferred embodiment of the present invention, what is claimed is:

1. In combination:
   input signal source means,
   a first NOR gate,
   a second NOR gate,
   each of said first and second NOR gates including a respective pair of interconnected multi-terminal transistor devices,
   clock terminal means to provide a clock enabling signal, and
   transmission gate means,
   said transmission gate means having a conduction path connected between said input signal source means and said first NOR gate and a control electrode connected to said clock terminal means to receive said clock enabling signal,
   a first transistor device from the pair of transistor devices included by said first NOR gate having control and conduction path terminals respectively cross-connected to conduction path and control terminals of a first transistor device from the pair of transistor devices included by said second NOR gate,
   the second transistor device from the pair of transistor devices included by said first NOR gate having a control terminal connected to the conduction path at said transmission gate means to receive an input signal therefrom, and
   the second transistor device from the pair of transistor devices included by said second NOR gate having a control terminal connected to said clock terminal means to receive said clock enabling signal.

2. The combination recited in claim 1, wherein said first and second NOR gates form a flip-flop.

3. The combination recited in claim 1, wherein said transmission gate means comprises a multi-terminal semiconductor device to selectively sample input signals from said source means.

4. The combination recited in claim 3, wherein said transmission gate means multi-terminal semiconductor device is a field effect transistor having conduction path terminals connected between said signal source means and the control terminal of the second transistor device included by said first NOR gate.

5. The combination recited in claim 1, including charge storage capacitance means connected to the control terminal of the second transistor device included by said first NOR gate,
said capacitance means adapted to be charged to a voltage indicative of a first logic level via the conduction path of said transmission gate means during the occurrence of said clock enabling signal, and
said capacitance means adapted to discharge to a voltage indicative of a second logic level during the absence of said clock enabling signal.

6. The combination recited in claim 1, wherein each transistor from the pairs of multi-terminal transistor devices included by said first and second NOR gates is a field effect transistor.

7. The combination recited in claim 6, wherein the channel width of said second field effect transistor included by said first NOR gate has a substantially larger channel width than those of said first field effect transistor included by said first NOR gate and each of the pair of field effect transistors included by said second NOR gate.

8. A data latch comprising:
a source of input signals,
bi-stable state means having a plurality of input terminals,
transmission gate means having a conduction path connected between said source of input signals and a first input terminal of said bi-stable state means, and
clock terminal means to receive a clock enabling signal, said clock terminal means connected to apply a clock enabling signal having a common polarity to each of a control electrode of said transmission gate means and to a second input terminal of said bi-stable state means to thereby enable said bi-stable state means and to render said transmission gate means conducting whenever said clock signal is present so that an input signal is supplied to said bi-stable state means via the conduction path of said transmission gate means.

9. The data latch recited in claim 8, wherein said bi-stable state means is a static flip-flop storage cell,
said flip-flop cell having dynamic storage means connected to said first input terminal thereof to receive and store an input signal via the conduction path of said transmission gate means during the presence of said clock enabling signal.

10. The data latch recited in claim 8, wherein said clock enabling signal has a clock cycle during which said clock signal is present for a first clock time interval and absent for a second time interval, said second time interval lasting longer than said first time interval.

* * * * *